United States Patent
Shin et al.

(10) Patent No.: US 12,457,850 B2
(45) Date of Patent: Oct. 28, 2025

(54) DISPLAY DEVICE AND MANUFACTURING METHOD THEREOF

(71) Applicant: SAMSUNG DISPLAY CO., LTD., Yongin-si (KR)

(72) Inventors: Jae Min Shin, Suwon-si (KR); Seung Bae Kang, Suwon-si (KR); Jong Ho Hong, Yongiin-si (KR); Gun Mo Kim, Hwaseong-si (KR); Min Woo Kim, Hwaseong-si (KR); Won Sang Park, Yongiin-si (KR); Hye Jin Joo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/758,940

(22) Filed: Jun. 28, 2024

(65) Prior Publication Data
US 2024/0357917 A1    Oct. 24, 2024

Related U.S. Application Data

(60) Continuation of application No. 17/209,849, filed on Mar. 23, 2021, now Pat. No. 12,052,909, which is a
(Continued)

(30) Foreign Application Priority Data

Sep. 23, 2016  (KR) .................. 10-2016-0122436

(51) Int. Cl.
 *H10K 59/10*  (2023.01)
 *H10K 30/00*  (2023.01)
(Continued)

(52) U.S. Cl.
 CPC .......... *H10K 59/10* (2023.02); *H10K 30/671* (2023.02); *H10K 50/844* (2023.02);
(Continued)

(58) Field of Classification Search
 CPC .... H10K 59/10; H10K 59/12; H10K 59/1201; H10K 59/126; H10K 59/1213;
(Continued)

(56) References Cited

U.S. PATENT DOCUMENTS 5,219,640 A   6/1993  Gazit et al.
5,583,320 A   12/1996 Eriguchi et al.
(Continued)

FOREIGN PATENT DOCUMENTS

CN  1509125 A   6/2004
CN  102969393 A  3/2013
(Continued)

OTHER PUBLICATIONS

European Search Report dated Feb. 19, 2018 in corresponding European Application No. 17182441.0 (5 pages).
(Continued)

*Primary Examiner* — Natalia A Gondarenko
(74) *Attorney, Agent, or Firm* — F. CHAU & ASSOCIATES, LLC

(57) ABSTRACT

A display device includes a plurality of islands and a bridge connecting the plurality of islands to each other. Each of the plurality of islands includes a flexible substrate, a thin film transistor positioned on a first surface of the flexible substrate, a first electrode connected to the thin film transistor, and a protective mask positioned on a second surface of the flexible substrate.

16 Claims, 14 Drawing Sheets

Related U.S. Application Data division of application No. 15/493,739, filed on Apr. 21, 2017, now Pat. No. 10,985,332.

(51) Int. Cl.
*H10K 50/844* (2023.01)
*H10K 59/12* (2023.01)
*H10K 59/131* (2023.01)
*H10K 59/35* (2023.01)
*H10K 59/80* (2023.01)
*H10K 71/00* (2023.01)
*H10K 77/10* (2023.01)

(52) U.S. Cl.
CPC ......... *H10K 59/131* (2023.02); *H10K 59/353* (2023.02); *H10K 59/873* (2023.02); *H10K 71/00* (2023.02); *H10K 77/111* (2023.02); *H10K 59/12* (2023.02)

(58) Field of Classification Search
CPC .. H10K 59/123; H10K 59/124; H10K 59/131; H10K 59/353; H10K 59/873; H10K 71/00; H10K 71/20; H10K 71/211; H10K 71/231; H10K 71/233; H10K 71/50; H10K 71/621; H10K 71/80; H10K 71/821; H10K 71/851; H10K 30/671; H10K 77/10; H10K 77/111; H10K 2102/00; H10K 50/844; H01L 21/311; H01L 21/31127; H01L 21/31116; H01L 21/31056; H01L 21/31122; H01L 21/302; H01L 21/304; H01L 21/4046; H01L 21/30625; H01L 21/32141; H01L 21/32132; Y02E 10/549; Y02P 70/50
USPC ..... 257/40, 72; 438/734, 743, 744, 723, 724
See application file for complete search history.

(56) References Cited

U.S. PATENT DOCUMENTS

| | | | |
|---|---|---|---|
| 5,942,446 A * | 8/1999 | Chen | H01L 21/31144 438/743 |
| 6,967,439 B2 | 11/2005 | Cok et al. | |
| 7,049,161 B2 | 5/2006 | Park et al. | |
| 7,307,281 B2 | 12/2007 | Park et al. | |
| 9,306,180 B2 | 4/2016 | Kim | |
| 9,356,087 B1 | 5/2016 | Lee et al. | |
| 9,490,311 B2 | 11/2016 | Park et al. | |
| 9,773,853 B2 | 9/2017 | Tao et al. | |
| 9,847,486 B2 | 12/2017 | Park et al. | |
| 9,978,987 B2 | 5/2018 | Okada et al. | |
| 9,989,791 B2 | 6/2018 | Cheng | |
| 10,263,053 B2 | 4/2019 | Beak et al. | |
| 10,319,799 B2 | 6/2019 | Nishinohara | |
| 10,446,769 B2 | 10/2019 | Kim et al. | |
| 10,985,332 B2 | 4/2021 | Shin et al. | |
| 2005/0212419 A1* | 9/2005 | Vazan | H10K 50/8445 313/504 |
| 2009/0096971 A1* | 4/2009 | Hioki | H10D 86/40 349/122 |
| 2012/0104399 A1 | 5/2012 | Choi et al. | |
| 2013/0148312 A1 | 6/2013 | Han et al. | |
| 2013/0169515 A1 | 7/2013 | Prushinskiy et al. | |
| 2014/0042406 A1 | 2/2014 | Degner et al. | |
| 2015/0115253 A1 | 4/2015 | Ha et al. | |
| 2015/0187849 A1 | 7/2015 | Kachatryan et al. | |
| 2015/0233557 A1 | 8/2015 | Aoyama et al. | |
| 2015/0280172 A1 | 10/2015 | Nishinohara et al. | |
| 2016/0028043 A1 | 1/2016 | Kwon et al. | |
| 2016/0099143 A1* | 4/2016 | Yan | C23C 16/45551 438/782 |
| 2016/0141551 A1 | 5/2016 | Seo et al. | |
| 2016/0181346 A1* | 6/2016 | Kwon | H10K 59/1213 257/40 |
| 2016/0204183 A1* | 7/2016 | Tao | H10K 71/00 438/34 |
| 2016/0268352 A1 | 9/2016 | Hong et al. | |
| 2017/0117446 A1 | 4/2017 | Tsuchiya et al. | |
| 2017/0229673 A1 | 8/2017 | Andou | |
| 2018/0004053 A1 | 1/2018 | Kawata | |
| 2018/0090699 A1 | 3/2018 | Shin et al. | |
| 2021/0210703 A1 | 7/2021 | Shin et al. | |

FOREIGN PATENT DOCUMENTS

| | | |
|---|---|---|
| CN | 105590949 A | 5/2016 |
| CN | 105789252 A | 7/2016 |
| EP | 1830336 | 9/2007 |
| JP | 2007-525713 | 9/2007 |
| KR | 10-2012-0052206 A | 5/2012 |
| KR | 1020120119266 | 10/2012 |
| KR | 10-2015-0017286 A | 2/2015 |
| KR | 1020150125151 | 11/2015 |
| KR | 10-2016-0020034 A | 2/2016 |
| KR | 1020160076005 | 6/2016 |
| KR | 10-2016-0093202 A | 8/2016 |
| WO | WO2015145533 A1 | 10/2015 |

OTHER PUBLICATIONS

Thomas Stieglitz, et al. "Flexible BIOMEMS with electrode arrangements on front and back side as key component in neural prostheses and biohybrid systems", Sensors and Actuators B, Chemical vol. 83, Issues 1-3, Mar. 15, 2002, pp. 8-14.

* cited by examiner

DISPLAY DEVICE AND MANUFACTURING METHOD THEREOF

CROSS-REFERENCE TO RELATED APPLICATION

This application is a Continuation of co-pending U.S. patent application Ser. No. 17/209,849, filed on Mar. 23, 2021, which is a Division of U.S. patent application Ser. No. 15/493,739, filed on Apr. 21, 2017 (Issued as U.S. Pat. No. 10,985,332 on Apr. 20, 2021), which claims priority under 35 U.S.C. § 119 to Korean Patent Application No. 10-2016-0122436 filed on Sep. 23, 2016, in the Korean Intellectual Property Office, the disclosures of which are incorporated by reference herein in their entirety.

TECHNICAL FIELD

The present invention relates to a display device and a manufacturing method thereof.

DISCUSSION OF RELATED ART

Electronic devices employ liquid crystal displays (LCDs) or organic light emitting diode (OLED) displays as a display device. The electronic devices include cellular phones, navigation systems, digital cameras, e-book readers, portable game devices, and various terminals, have been used.

Recently, the electronic devices have been developed to be flexible or foldable or stretchable. For example, foldable display devices, bendable display devices, or stretchable display devices have been under development.

SUMMARY

According to an exemplary embodiment of the present invention, a display device includes a plurality of islands and a bridge connecting the plurality of islands to each other. Each of the plurality of islands includes a flexible substrate, a thin film transistor positioned on a first surface of the flexible substrate, a first electrode connected to the thin film transistor, and a protective mask positioned on a second surface of the flexible substrate.

According to an exemplary embodiment of the present invention, a manufacturing method of a display device is provided as follows. An auxiliary flexible substrate is formed. A protective mask is formed on the auxiliary flexible substrate. A preliminary flexible substrate is formed on the auxiliary flexible substrate and the protective mask. A thin film transistor and a first electrode connected to the thin film transistor are formed on the preliminary flexible substrate. The auxiliary flexible substrate and the preliminary flexible substrate are patterned by using the protective mask to form a flexible substrate.

According to an exemplary embodiment of the present invention, a display device is provided as follows. A flexible substrate includes a display area and a peripheral area. The peripheral area includes a bending area and a non-bending area. A pixel portion is positioned on an outside surface of the display area of the flexible substrate. A protective mask is positioned on the display area of the flexible substrate and an inside surface of the non-bending area. A driving circuit portion is positioned on an outside surface of the non-bending area of the flexible substrate. A wire portion connects the pixel portion and the driving circuit portion. The wire portion is positioned on the outside surface of the bending area of the flexible substrate.

According to an exemplary embodiment of the present invention, a manufacturing method of a display device is provided as follows. An auxiliary flexible substrate is formed. A protective mask is formed on the auxiliary flexible substrate. A preliminary flexible substrate includes a display area and a peripheral area on the auxiliary flexible substrate and the protective mask. The peripheral area includes a bending area and a non-bending area. A pixel portion is formed on a display area of the preliminary flexible substrate. A driving circuit portion is formed on a non-bending area of the preliminary flexible substrate. The auxiliary flexible substrate and the preliminary flexible substrate are patterned by using the protective mask to form a flexible substrate.

According to an exemplary embodiment of the present invention, a manufacturing method of a display device is provided as follows.

An auxiliary flexible substrate is formed. A protective mask is formed on a first surface of the auxiliary flexible substrate. A preliminary flexible substrate is formed on the first surface of the auxiliary flexible substrate and the protective mask so that the preliminary flexible substrate covers the protective mask. A pixel portion is formed on the preliminary flexible substrate. An etching process is performed on a second surface of the auxiliary flexible substrate to form a flexible substrate having a lateral surface in a reverse tapered shape. The second surface of the auxiliary flexible substrate is opposite to the first surface of the auxiliary flexible substrate.

BRIEF DESCRIPTION OF DRAWINGS

These and other features of the present invention will become more apparent by describing in detail exemplary embodiments thereof with reference to the accompanying drawings of which.

DETAILED DESCRIPTION OF EXEMPLARY EMBODIMENTS

Figure 1:
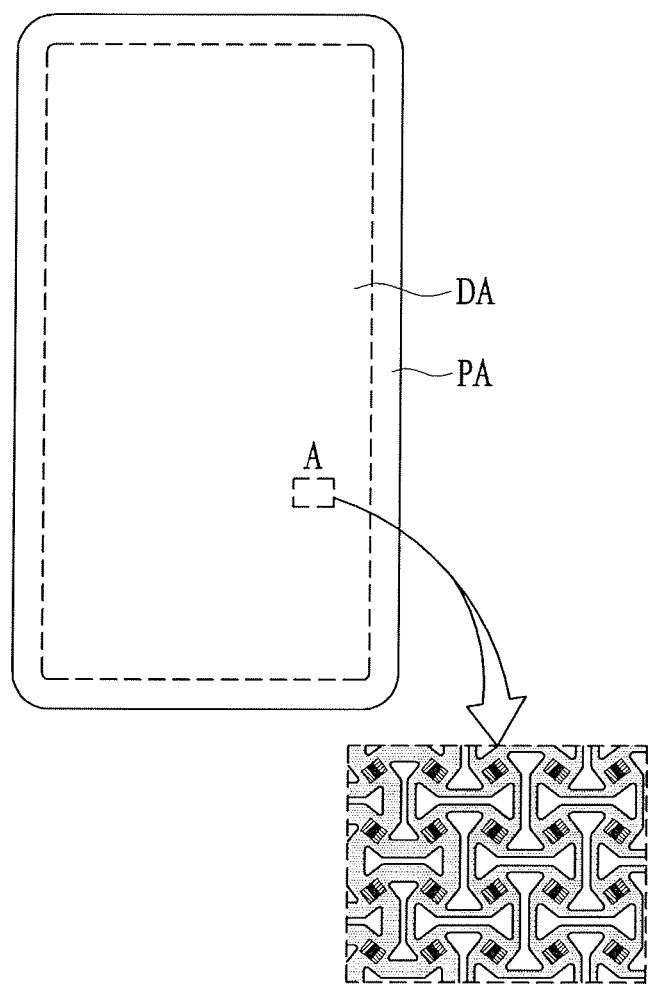
FIG. 1 illustrates a schematic top plan view of a display device according to an exemplary embodiment.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Hereinafter, a display device according to an exemplary embodiment will be described with reference to FIG. 1 to FIG. 4.

Figure 2:
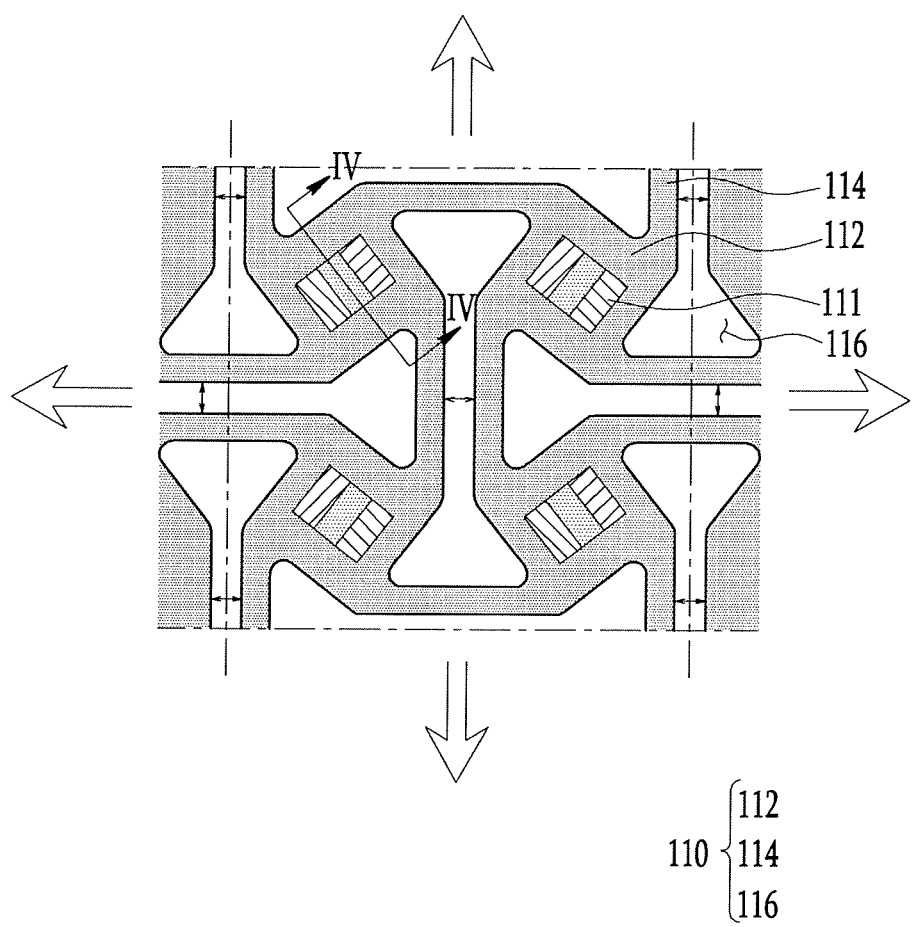
FIG. 2 and FIG. 3 illustrate enlarged views of some of region "A" of FIG. 1.
Figure 3:
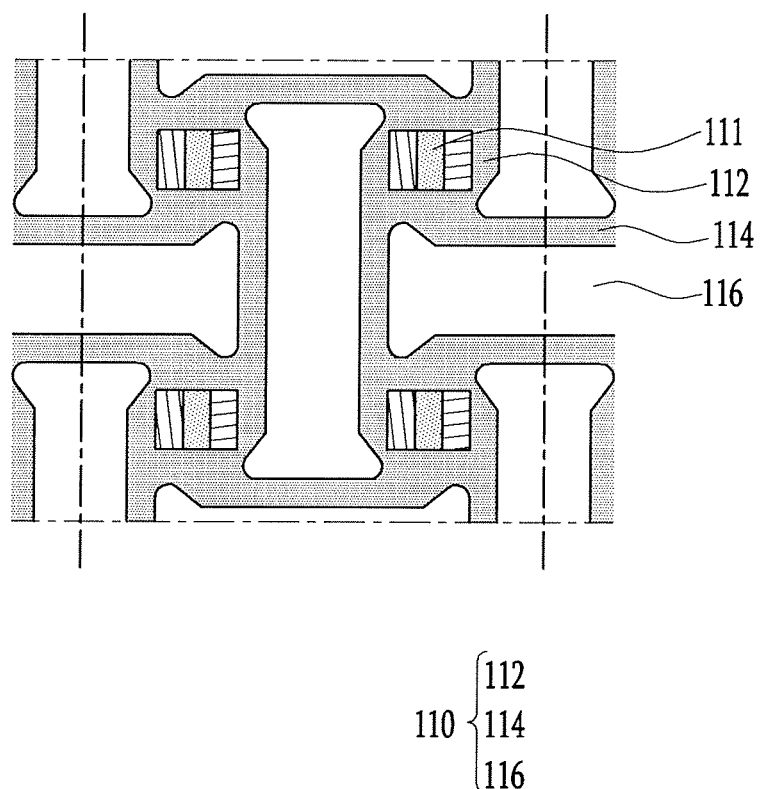
Figure 4:
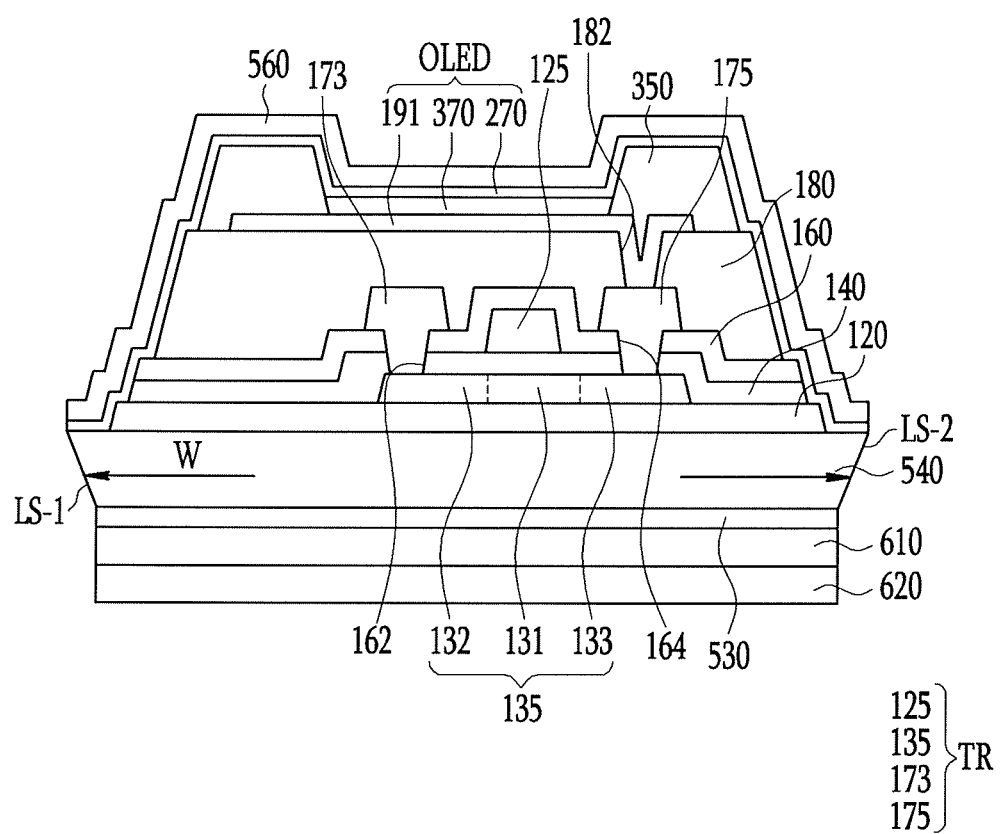
FIG. 4 illustrates a cross-sectional view taken along line IV-IV of FIG. 2.

FIG. 1 illustrates a schematic top plan view of a display device according to an exemplary embodiment, FIG. 2 and FIG. 3 illustrate enlarged views of some of region "A" of FIG. 1, and FIG. 4 illustrates a cross-sectional view taken along line IV-IV of FIG. 2. FIG. 2 illustrates a state in which the display device is not stretched, and FIG. 3 illustrates a state in which the display device is stretched.

As shown in FIG. 1, a display device 100 according to an exemplary embodiment includes a display area DA and a peripheral area (PA).

The display area DA may display an image, and a thin film transistor and an organic light emitting diode may be positioned for each pixel in the display area DA. The organic light emitting diode may emit light in each pixel to display an image. The peripheral area (PA) surrounds the display area DA, and a driving circuit, a driving chip, various wires, a printed circuit board (PCB), etc. for supplying power and display signals may be positioned in the peripheral area (PA). For example, a gate driver, a data driver, etc. for transmitting predetermined signals for driving the display area DA may be positioned in the peripheral area (PA).

The display device 100 according to the exemplary embodiment includes a plurality of stretchable units, thereby implementing a stretchable display device. Hereinafter, the plurality of stretchable units will be described with reference to FIG. 2 and FIG. 3.

As shown in FIG. 2 and FIG. 3, a stretchable unit 110 includes an island 112, a bridge 114, and an opening 116. The stretchable unit 110 corresponds to a basic unit of the display device 100 according to the present exemplary embodiment. In this case, the island 112 represents an area in which a pixel 111 is disposed.

A plurality of islands 112 is disposed to be spaced apart from each other by a predetermined distance. The pixel 111 is positioned at each of the plurality of the islands 112. The pixel 111 may include three subpixels. For example, the three subpixels may include a red subpixel, a green subpixel, and a blue subpixel. However, the present invention is not limited thereto. For example, the pixel 111 may include three or more subpixels. Different subpixels may be positioned at each of the plurality of islands 112. The pixel 111 may be in plural. In this case, each pixel 111 may be positioned at each of the plurality of the islands 112, having three subpixels or more.

The bridge 114 may extend from a border of the island 112 to connect islands 112 that are adjacent to each other. Conductive wires for connecting the pixels 111 positioned at respective islands 112 may be positioned at the bridge 114. The wire positioned at the bridge 114 may supply power and electrical signals to the pixel 111 positioned at the island 112.

The opening 116 is respectively positioned between the islands 112, the bridges 114, and the bridge 114 and the island 112. A shape or a size of the opening 116 may be changed so that the display device 100 may be stretched.

As a size of the opening 116 included in the stretchable unit 110 varies, the display device 100 may be stretched. The display device 100 may be stretched in various directions, for example, down, up, left, and right directions. In this case, a shape or an area of the island 112 may not be substantially changed, but a position of the island 112 may be changed. Accordingly, even if the display device 100 is stretched, the pixel 111 positioned on the island 112 may not be damaged, thereby maintaining the image displayed by the display device 100.

Hereinafter, one island 112 will be described more fully with reference to FIG. 4.

As shown in FIG. 4, each island 112 includes a flexible substrate 540, a thin film transistor TR positioned on an upper surface of the flexible substrate 540, and a first electrode 191 connected to the thin film transistor TR.

The flexible substrate 540 may include a flexible material. For example, the flexible substrate 540 may be formed to be a film type including a polyester-based polymer, a silicon-based polymer, an acryl-based polymer, a polyolefin-based polymer, or a copolymer thereof. The present invention is not limited thereto. For example, the flexible substrate 540 may include polyethylene terephthalate (PET), polybutylene terephthalate (PBT), polysilane, polysiloxane, polysilazane, polycarbosilane, polyacrylate, polymethacrylate, poly (methyl acrylate), poly(ethyl acrylate), poly(ethyl methacrylate), a cyclic olefin copolymer (COC), a cyclic olefin polymer (COP), polyethylene (PE), polypropylene (PP), a polyimide (PI), poly(methyl methacrylate) (PMMA), polystyrene (PS), polyacetal (POM), polyetheretherketone (PEEK), polyethersulfone (PES), polytetrafluoroethylene (PTFE), polyvinylchloride (PVC), polycarbonate (PC), polyvinylidene fluoride (PVDF), a perfluoroalkyl polymer (PFA), a styrene acrylonitrile (SAN) copolymer, or a combination thereof.

The flexible substrate 540 may have a reverse tapered shape. The flexible substrate 540 may be patterned through a backside etching process, thus a lateral surface of the flexible substrate 540 may be reverse tapered. For example, the flexible substrate 540 may have a first lateral surface LS-1 and a second lateral surface LS-2. In this case, a distance W of between the first lateral surface LS-1 and the second lateral surface LS-2 increases upwardly toward the transistor TR.

In an etching process of the flexible substrate 540, ultraviolet rays may be used. When the flexible substrate 540 is made of a yellow material such as polyimide (PI), light of a short wavelength such as ultraviolet rays may be blocked in the etching process. If the ultraviolet rays penetrate the thin film transistor TR, the characteristic of the thin film transistor TR may change. Accordingly, the characteristic change of the thin film transistor TR may be prevented in the etching process due to the incident of the ultraviolet rays on the thin film transistor TR.

A buffer layer 120 may be positioned on a first surface of the flexible substrate 540 (e.g., an upper surface thereof). The buffer layer 120 may be formed with a single layer of silicon nitride (SiNx) or with a multilayer including silicon nitride (SiNx) and silicon oxide (SiOx) stacked on each other. The buffer layer 120 serves to planarize a surface of the flexible substrate 540 while preventing undesirable materials such as impurities or moisture from permeating. The present invention is not limited thereto. For example, the buffer layer 120 may be omitted.

A semiconductor layer 135 is positioned on the buffer layer 120. The semiconductor layer 135 may be made of a polycrystalline semiconductor material or an oxide semiconductor material. In addition, the semiconductor layer 135 includes a channel region 131 and contact doping regions 132 and 133 that are positioned at opposite sides of the channel region 131. The contact doping regions 132 and 133 may be referred to as a source region 132 and a drain region 133, respectively. In an exemplary embodiment, the channel region 131 is not doped with impurities, and the source region 132 and the drain region 133 may be doped with impurities. The impurities vary depending on a kind of the thin film transistor.

A gate insulating layer 140 is positioned on the semiconductor layer 135. The gate insulating layer 140 may include an inorganic or organic insulating material such as silicon oxide (SiOx), silicon nitride (SiNx), silicon oxynitride (SiON), silicon oxyfluoride (SiOF), and aluminum oxide (AlOx). The gate insulating layer 140 may be formed in a single layer or a multilayer including silicon oxide (SiOx), silicon nitride (SiNx), silicon oxynitride (SiON), silicon oxyfluoride (SiOF), or aluminum oxide (AlOx).

A gate electrode 125 is positioned on the gate insulating layer 140. In this case, the gate electrode 125 overlaps at least some of the semiconductor layer 135. For example, the gate electrode 125 overlaps the channel region 131 of the semiconductor layer 135.

An interlayer insulating layer 160 is positioned on the gate electrode 125 and the gate insulating layer 140. The interlayer insulating layer 160 may be made of an inorganic insulating material or an organic insulating material such as silicon oxide (SiOx), silicon nitride (SiNx), silicon oxynitride (SiON), silicon oxyfluoride (SiOF), and aluminum oxide (AlOx). The interlayer insulating layer 160 may be formed in a single layer or a multilayer including silicon oxide (SiOx), silicon nitride (SiNx), silicon oxynitride (SiON), silicon oxyfluoride (SiOF), or aluminum oxide (AlOx).

Contact holes 162 and 164 penetrate the gate insulating layer 140 and the interlayer insulating layer 160 to expose the semiconductor layer 135. For example, the contact holes 162 and 164 expose the contact doping regions 132 and 133 of the semiconductor layer 135.

A source electrode 173 and a drain electrode 175 are positioned on the interlayer insulating layer 160. In addition, the source electrode 173 and the drain electrode 175 are respectively connected to the source region 132 and the drain region 133 of the semiconductor layer 135 through the contact holes 162 and 164.

As such, the semiconductor layer 135, the gate electrode 125, the source electrode 173, and the drain electrode 175 form one thin film transistor TR. The present invention is not limited thereto. For example, the thin film transistor TR have various structures. The organic light emitting diode may include a switching transistor and a driving transistor, and the aforementioned thin film transistor TR may be the driving transistor. Although not illustrated, a switching thin film transistor may be further provided.

A passivation layer 180 is positioned on the thin film transistor TR and the interlayer insulating layer 160. The passivation layer 180 serves to remove and flatten steps, thereby increasing luminous efficiency of the OLED to be formed thereon. For example, the passivation layer 180 may cover the thin film transistor TR, providing a planarized surface above the thin film transistor TR. A contact hole 182 overlapping the drain electrode 175 is formed to penetrate the passivation layer 180. For example, the contact hole 182 exposes the drain electrode 175.

The passivation layer 180 may be made of a polyacrylate resin, an epoxy resin, a phenolic resin, a polyamide resin, a polyimide resin, an unsaturated polyester resin, a polyphenylene resin, a polyphenylene sulfide resin, or benzocyclobutene (BCB).

The first electrode 191 is positioned on the passivation layer 180. The first electrode 191 may be made of a transparent conductive material such indium tin oxide (ITO), indium zinc oxide (IZO), zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The first electrode 191 is electrically connected to the drain electrode 175 of the thin film transistor TR through the contact hole 182 provided in the passivation layer 180. The first electrode 191 serves as an anode of the organic light emitting diode (OLED).

Although not illustrated, the first electrode 191 may include first and second transparent electrodes including a transparent conductive material, and a semi-transmissive layer positioned between the first and second transparent electrodes to form a microcavity together with a second electrode 270. For example, the first electrode 191 may be formed as a multilayer including a layer made of the transparent conductive material and a layer made of a reflective metal material.

A pixel defining layer 350 is positioned on the passivation layer 180 and on an edge portion of the first electrode 191. The pixel defining layer 350 may be formed to surround a pixel. The pixel defining layer 350 may include a resin such as a polyacrylate resin and a polyimide resin, or a silica-based inorganic material.

An organic emission layer 370 is positioned on the first electrode 191. The organic emission layer 370 may include an emission layer, a hole-injection layer (HIL), a hole-transporting layer (HTL), an electron-transporting layer (ETL), or an electron-injection layer (EIL).

The organic emission layer 370 may include a red organic emission layer for emitting red light, a green organic emission layer for emitting green light, and a blue organic emission layer for emitting blue light. In an exemplary embodiment, the organic emission layer 370 may have a structure in which the red organic emission layer, the green organic emission layer, and the blue organic emission layer are respectively stacked on corresponding pixels. In this case, a color image may be implemented by forming a red filter, a green filter, or a blue filter for each pixel. In an exemplary embodiment, by forming a white organic emission layer for emitting white light at each pixel and by forming a red filter, a green filter, and a blue filter for each pixel, it is possible to implement a color image.

The second electrode 270 is positioned on the organic emission layer 370 and the pixel defining layer 350. The second electrode 270 may be made of a transparent conductive material such as indium tin oxide (ITO), indium zinc oxide (IZO), zinc oxide (ZnO), indium oxide (In2O3), etc., or a reflective metal such as lithium (Li), calcium (Ca), lithium fluoride/calcium (LiF/Ca), lithium fluoride/aluminum (LiF/Al), aluminum (Al), silver (Ag), magnesium (Mg), gold (Au), etc. The second electrode 270 may be a cathode of the organic light emitting diode (OLED). The first electrode 191, the organic emission layer 370, and the second electrode 270 may form the organic light emitting diode (OLED).

An encapsulation layer 560 may be positioned on the second electrode 270. The encapsulation layer 560 covers the organic light emitting diode (OLED), thereby preventing the moisture from permeating into the organic light emitting diode (OLED).

Edges of the second electrode 270 and the encapsulation layer 560 coincide with an edge of the upper surface of the flexible substrate 540. Accordingly, the second electrode 270 and the encapsulation layer 560 may have the same shape as that of the flexible substrate 540 in a plan view.

A protective mask 530 is positioned on a second surface of the flexible substrate 540 (e.g., a lower surface thereof).

The protective mask 530 may be made of a metal or inorganic insulating material. For example, the protective mask 530 may include amorphous silicon (a-Si). The protective mask 530 may block light of a short wavelength such as ultraviolet rays. With the protective mask 530, ultraviolet rays is prevented from being incident to the thin film transistor TR. Accordingly, characteristic change of the thin film transistor TR due to the ultraviolet rays may be prevented.

A protection film 620 may be positioned on the protective mask 530, and an adhesive layer 610 may be positioned between the protective mask 530 and the protection film 620.

The protection film 620 serves to protect the flexible substrate 540, and may be formed as a single layer or a multilayer.

The adhesive layer 610 serves to bond the flexible substrate 540 and the protection film 620 to each other, and may include an optical clear adhesive (OCA), an optical clear resin (OCR), a pressure sensitive adhesive (PSA), or the like.

As aforementioned elements, the protection film 620, the adhesive layer 610, the protective mask 530, the flexible substrate 540, the buffer layer 120, the thin film transistor TR, the gate insulating layer 140, the interlayer insulating layer 160, the passivation layer 180, the first electrode 191, the organic emission layer 370, the second electrode 270, and the encapsulation layer 560 are positioned in the island 112, but are not positioned in the opening 116.

It has been exemplarily described that the display device according the present exemplary embodiment includes the organic light emitting diode, but the present invention is not limited thereto. For example, the present invention may be applied to a liquid crystal display and the like.

Hereinafter, a manufacturing method of the display device according to an exemplary embodiment will be described with reference to FIG. 5 to FIG. 10.

FIG. 5 to FIG. 10 illustrate process cross-sectional views of a manufacturing method of a display device according to an exemplary embodiment.

Figure 5:
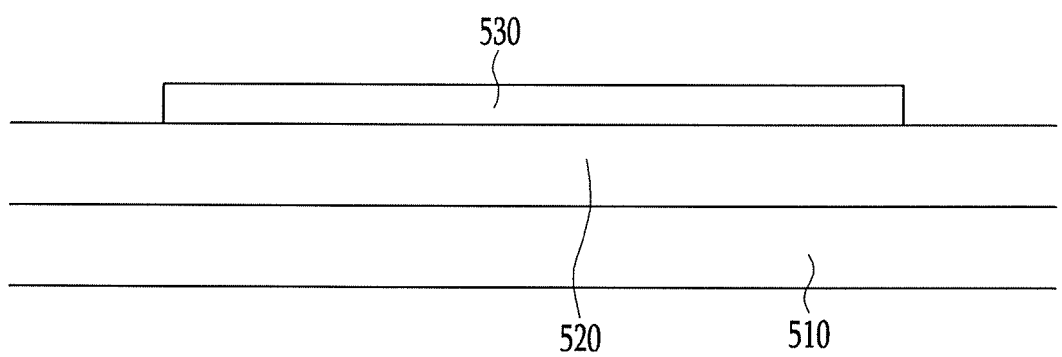
FIG. 5 to FIG. 10 illustrate process cross-sectional views of a manufacturing method of a display device according to an exemplary embodiment.

As shown in FIG. 5, an auxiliary flexible substrate 520 made of a flexible material is formed on a carrier substrate 510 made of a solid material. The auxiliary flexible substrate 520 may be formed to be a film type including one of a polyester-based polymer, a silicon-based polymer, an acryl-based polymer, a polyolefin-based polymer, and a copolymer thereof. For example, the auxiliary flexible substrate 520 may be made of a polyimide.

The protective mask 530 is formed by depositing a preliminary protective mask layer formed of a metal or inorganic insulating material on the auxiliary flexible substrate 520 and then patterning the preliminary protective mask layer. The protective mask 530 may be formed as a single layer or a multilayer. For example, the protective mask 530 may be formed by sequentially depositing silicon oxide (SiOx), silicon nitride (SiNx), and amorphous silicon (a-Si), and then simultaneously patterning them.

Figure 6:
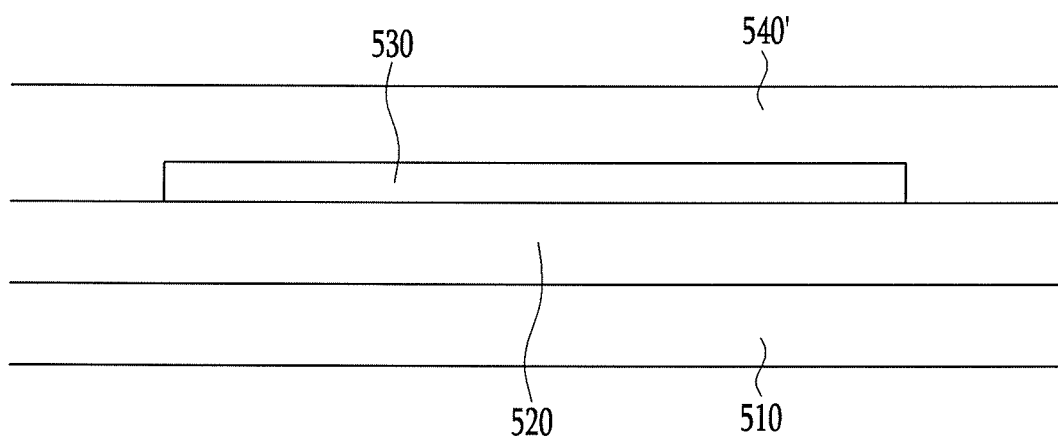

As shown in FIG. 6, a preliminary flexible substrate 540' is formed on the auxiliary flexible substrate 520 and the protective mask 530 by using a flexible material. The preliminary flexible substrate 540' may be made of the same material or a different material as or from that of the auxiliary flexible substrate 520.

Figure 7:
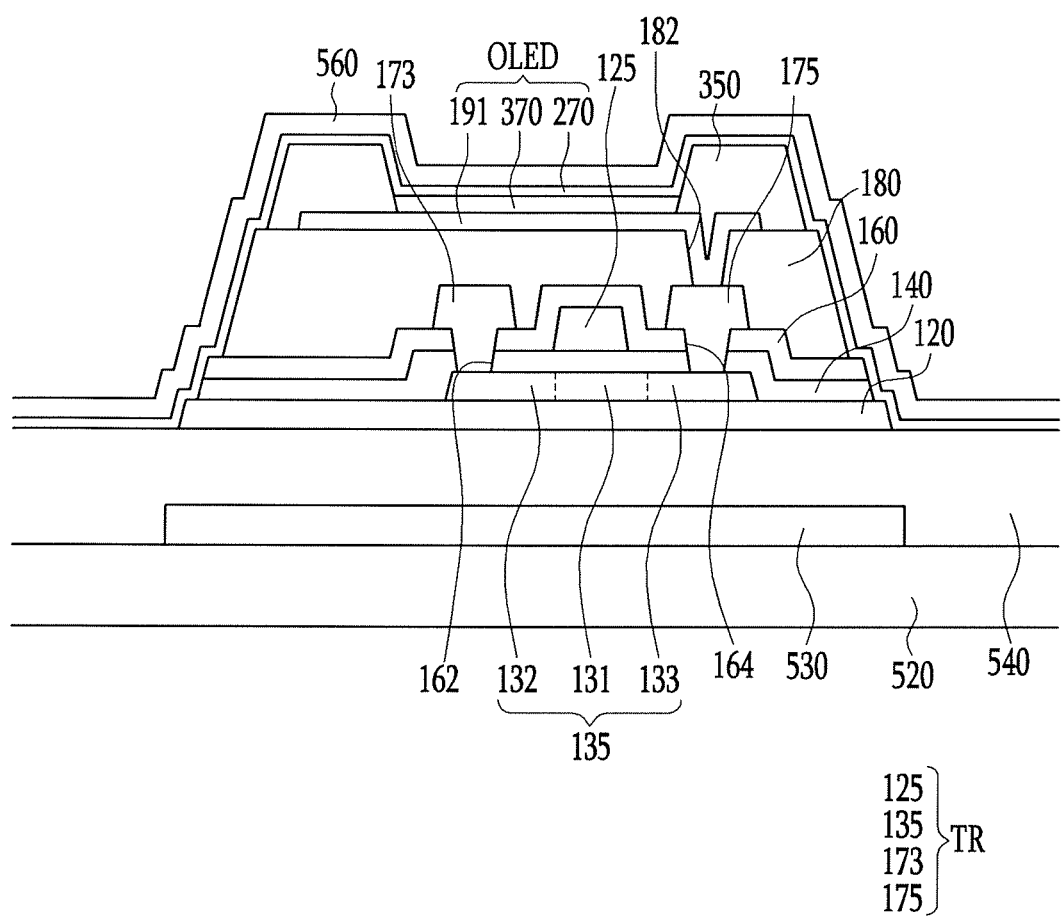

As shown in FIG. 7, the thin film transistor TR and the first electrode 191 connected to the thin film transistor TR are formed on the preliminary flexible substrate 540'.

The buffer layer 120 is formed on the preliminary flexible substrate 540', the semiconductor layer 135 is formed on the buffer layer 120, and the gate insulating layer 140 is formed on the semiconductor layer 135. The gate electrode 125 is formed on the gate insulating layer 140 to overlap the semiconductor layer 135, and the interlayer insulating layer 160 is formed on the gate electrode 125. The contact holes 162 and 164 are provided in the gate insulating layer 140 and the interlayer insulating layer 160 to overlap at least some of the semiconductor layer 135. The source electrode 173 and the drain electrode 175 are formed on the interlayer insulating layer 160 such that the source electrode 173 and the drain electrode 175 are respectively connected to the source region 132 and the drain region 133 of the semiconductor layer 135 through the contact holes 162 and 164. As such, with the semiconductor layer 135, the gate electrode 125, the source electrode 173, and the drain electrode 175, the thin film transistor TR is formed.

Next, the passivation layer 180 is formed on the thin film transistor TR and the interlayer insulating layer 160, and the contact hole 182 is provided in the passivation layer 180 to overlap at least some of the drain electrode 175. The first electrode 191 is formed on the passivation layer 180 so that the first electrode 191 is connected to the drain electrode 175 through the contact hole 182.

Next, the pixel defining layer 350 is formed to overlap an edge of the first electrode 191. The organic emission layer 370 is formed in a pixel surrounded by the pixel defining layer 350. However, the present invention is not limited thereto, and the organic emission layer 370 may be formed outside the pixel.

Next, the second electrode 270 is formed on the organic emission layer 370 and the pixel defining layer 350, and the encapsulation layer 560 is formed on the second electrode 270. After forming the encapsulation layer 560, the carrier substrate 510 is separated and removed from the auxiliary flexible substrate 520.

The thin film transistor TR and the first electrode 191 are formed to overlap the protective mask 530. For example, the buffer layer 120, the semiconductor layer 135, the gate insulating layer 140, the gate electrode 125, the interlayer insulating layer 160, the source electrode 173, the drain electrode 175, the passivation layer 180, the first electrode 191, and the organic emission layer 370 are not formed at a portion that does not overlap the protective mask 530.

Figure 8:
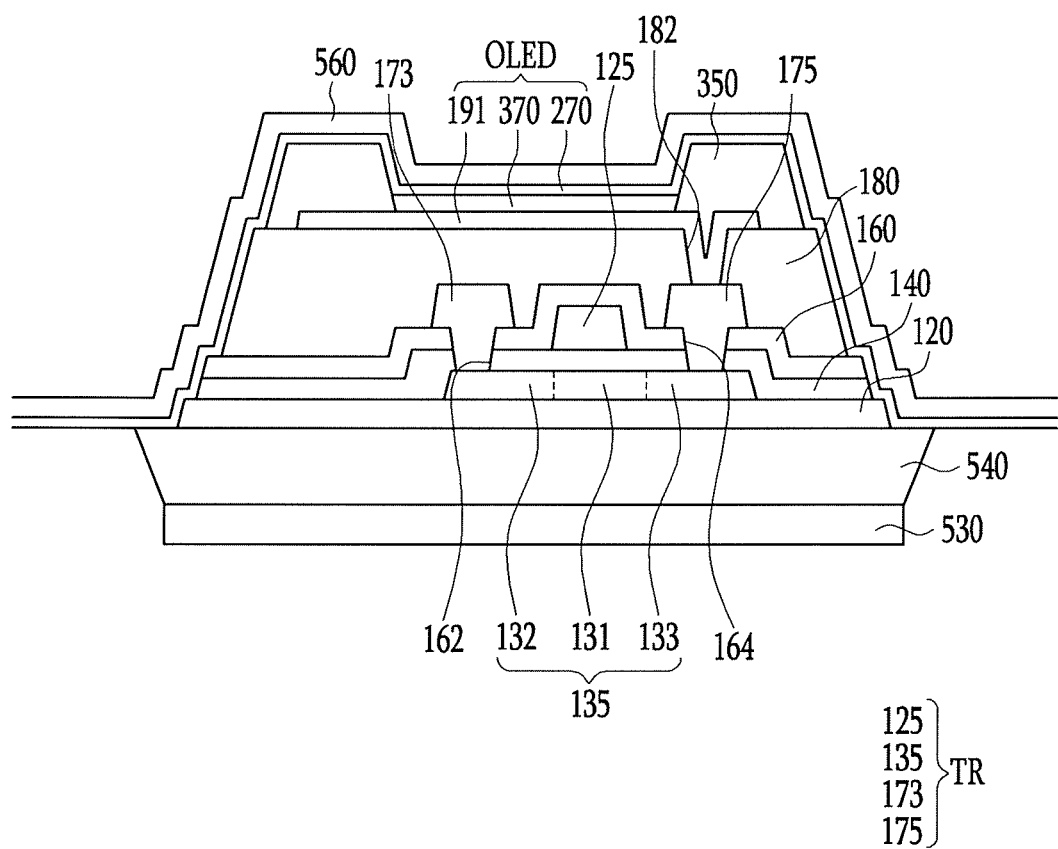

As shown in FIG. 8, a dry etching process is performed through an oxygen plasma treatment at a rear surface of the display device. In an exemplary embodiment, the oxygen plasma of the dry etching process may be generated using ultraviolet rays. The present invention is not limited thereto. Since a lower surface of the auxiliary flexible substrate 520 is entirely exposed, the auxiliary flexible substrate 520 is entirely removed by the etching process. Some of the flexible substrate 540 is covered by the protective mask 530, and the remaining part of the flexible substrate 540 is exposed. Accordingly, the preliminary flexible substrate 540' is patterned using the protective mask 530. A portion of the preliminary flexible substrate 540' that does not overlap the protective mask 530 is removed, and a portion of the preliminary flexible substrate 540' that overlaps the protective mask 530 remains.

In this case, since the backside etching process is performed, a lateral surface of the remaining part of the flexible substrate 540 has a reverse tapered shape. For example, a shape of the flexible substrate 540 is gradually broadened from a lower surface thereof contacting the protective mask 530 to an upper surface thereof contacting the buffer layer 120.

Ultraviolet rays are irradiated during the backside etching process, and when the ultraviolet rays reach the thin film transistor TR, characteristics of the thin film transistor TR may be changed. In the present exemplary embodiment, since the ultraviolet rays are blocked by the flexible substrate 540 and the protective mask 530 so that the ultraviolet rays do not reach the thin film transistor TR during the backside etching process, it is possible to maintain the characteristics of the thin film transistor TR.

Figure 9:
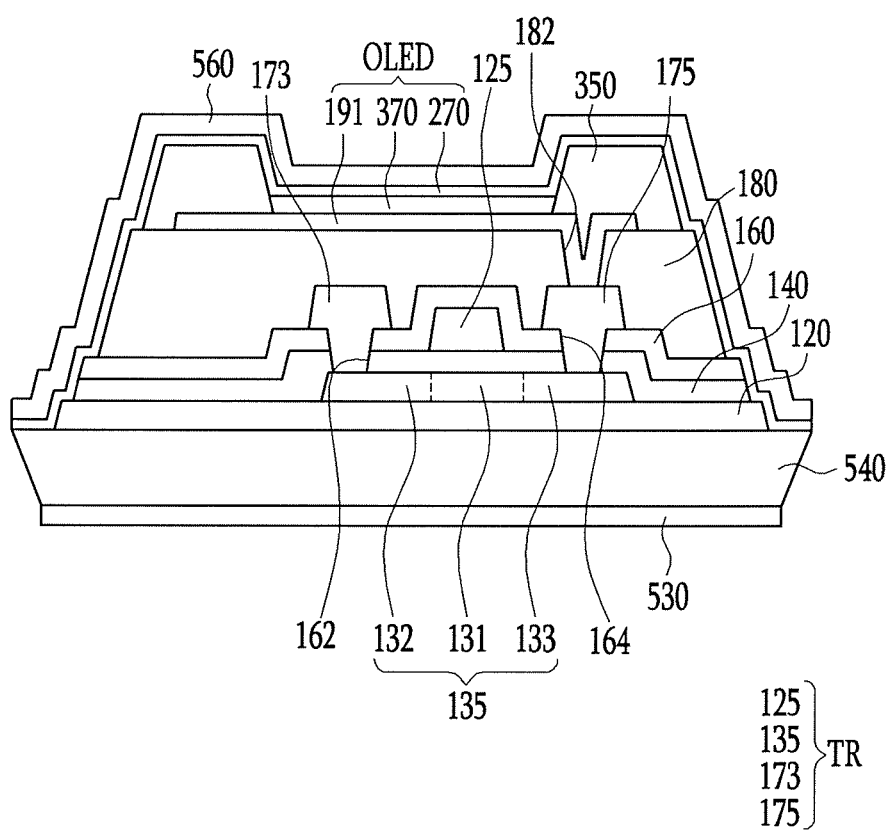

As shown in FIG. 9, the protective mask 530, the second electrode 270, and the encapsulation layer 560 are etched through the dry etching process. Portions of the second electrode 270 and the encapsulation layer 560 that do not overlap the protective mask 530 are removed, and a thickness of the protective mask 530 decreases. When the protective mask 530 is formed with triple layers including silicon nitride (SiNx), silicon oxide (SiOx), and amorphous silicon (a-Si), two layers formed by the silicon nitride and silicon oxide may be removed, and one layer formed by amorphous silicon may remain. However, the present invention is not limited thereto. For example, all of the protective mask 530 may be removed.

The edges of the second electrode 270 and the encapsulation layer 560 coincide with an edge of the upper surface of the flexible substrate 540. Accordingly, the second electrode 270 and the encapsulation layer 560 may have the same shape as that of the flexible substrate 540 in a plan view.

Figure 10:
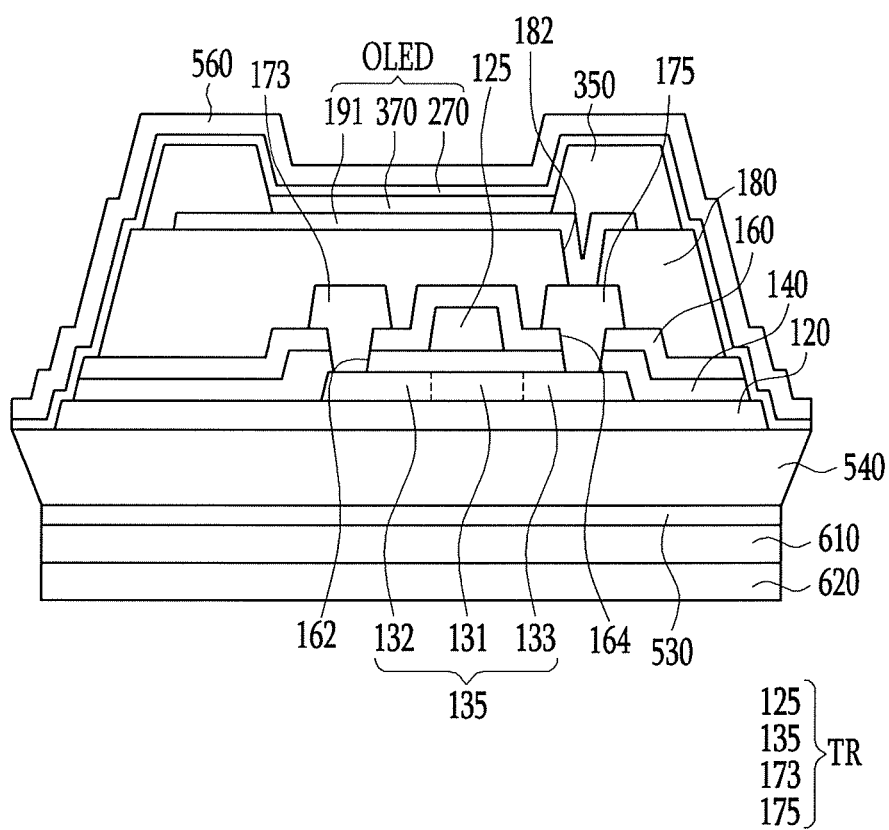

As shown in FIG. 10, the adhesive layer 610 may be formed on the protective mask 530, and the protection film 620 may be formed on the adhesive layer 610. The protection film 620 may be adhered to the protective mask 530 through the adhesive layer 610.

Hereinafter, a display device according to an exemplary embodiment will be described with reference to FIG. 11.

Figure 11:
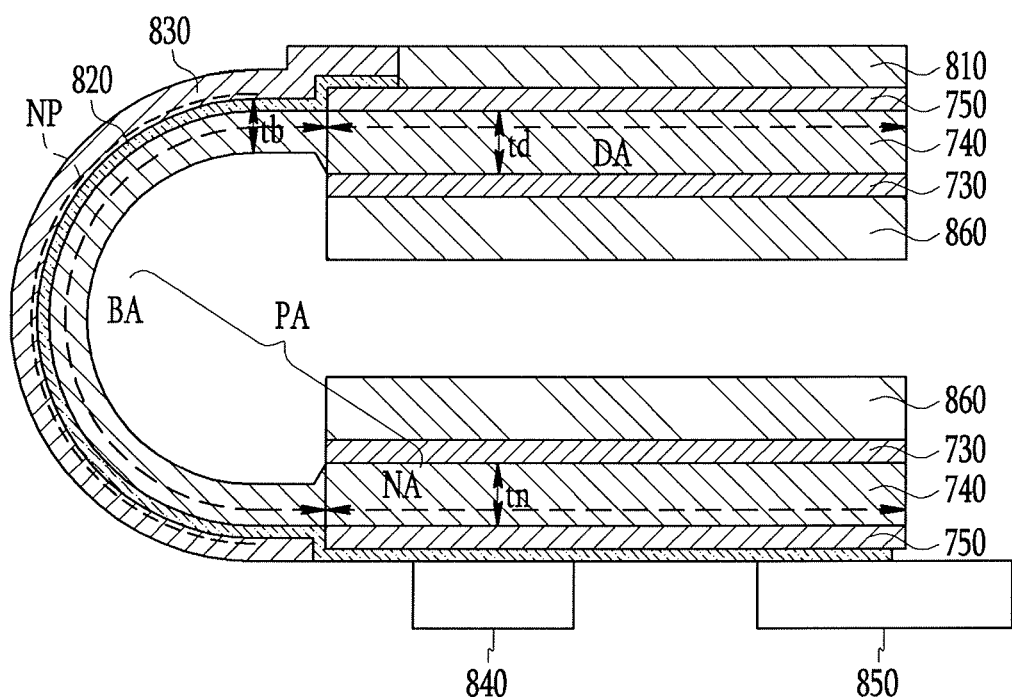
FIG. 11 illustrates a cross-sectional view of a display device according to an exemplary embodiment.

FIG. 11 illustrates a cross-sectional view of a display device according to an exemplary embodiment. For the convenience of description. FIG. 11 shows a resulting shape after the display device is bent.

As shown in FIG. 11, a display device according to an exemplary embodiment includes a flexible substrate 740, a pixel portion 810 positioned on the flexible substrate 740, a driving circuit portion 840, and a protective mask 730.

The flexible substrate 740 includes the display area DA and the peripheral area PA, and the peripheral area PA of the flexible substrate 740 includes a bending area BA and a non-bending area NA.

The flexible substrate 740 may be bent, and particularly, the bending area BA is bent to have a semi-circular shape such that the display area DA and the non-bending area NA of the peripheral area PA face each other. In this case, a surface where the display area DA and the non-bending area NA of the peripheral area PA face each other may be defined as an inside surface of the flexible substrate 740. In addition, a surface positioned at an opposite side of the inside surface of the flexible substrate 740 may be defined as an outside surface of the flexible substrate 740. In FIG. 11, a lower surface of the display area DA of the flexible substrate 740, a right surface of the bending area BA, and an upper surface of the non-bending area NA may respectively correspond to the inside surface of the flexible substrate 740. An upper surface of the display area DA of the flexible substrate 740, a left surface of the bending area BA, and a lower surface of the non-bending area NA may respectively correspond to the outside surface of the flexible substrate 740.

The pixel portion 810 is positioned on the display area DA of the flexible substrate 740. For example, the pixel portion 810 may be positioned on the outside surface of the display area DA of the flexible substrate 740. The pixel portion 810 may include a plurality of pixels, and each pixel may include a thin film transistor and an electrode connected to the thin film transistor. A buffer layer 750 may be further positioned between the flexible substrate 740 and the pixel portion 810.

The driving circuit portion 840 is positioned on the peripheral area PA of the flexible substrate 740. For example, the driving circuit portion 840 may be positioned on the outside surface of the peripheral area PA of the flexible substrate 740. The buffer layer 750 may be further positioned between the flexible substrate 740 and the driving circuit portion 840.

The pixel portion 810 and the driving circuit portion 840 are connected to each other by a wire portion 820. The wire portion 820 is positioned on an edge of the display area DA of the flexible substrate 740. The wire portion 820 is further positioned on the bending area BA and the non-bending area NA of the peripheral area PA. For example, the wire portion 820 may be positioned on the outside of the flexible substrate 740. In the bending area BA of the flexible substrate 740, the wire portion 820 may be bent together with the flexible substrate 740 according to a shape in which the flexible substrate 740 is bent.

An overcoat 830 for protecting the wire portion 820 may be positioned on the bending area BA of the flexible substrate 740.

In addition, a flexible circuit board 850 may be further positioned on the non-bending area NA of the flexible substrate 740. The flexible circuit board 850 may be positioned on the outside surface of the non-bending area NA of the flexible substrate 740. The flexible circuit board 850 may be connected to the driving circuit portion 840 through the wire portion 820.

The protective mask 730 may be positioned on the display area DA and the non-bending area NA of the flexible substrate 740. For example, the protective mask 730 may be positioned on the display area DA and the non-bending area NA of the flexible substrate 740. The protective mask 730 is not positioned on the bending area BA of the flexible substrate 740. The protective mask 730 may be made of a metal or inorganic insulating material. A protection film 860 may be further positioned on the protective mask 730.

The flexible substrate 740 may have different thicknesses for each area. A thickness (tb) of the bending area BA of the flexible substrate 740 may be thinner than a thickness (td) of the display area DA, and it may be thinner than a thickness (tn) of the non-bending area NA. For example, the thickness (tb) of the bending area BA of the flexible substrate 740 is about 3 μm, and the thickness (tn) of the non-bending area NA may be about 5 μm. For example, a thickness of a portion at which a flexible substrate 740 contacts the protective mask 730 is thicker than that of a portion at which the flexible substrate 740 does not contact the protective mask 730.

If the thickness of the flexible substrate 740 is entirely constant, a neutral surface NP is positioned inside the flexible substrate 740. The neutral surface NP means a portion where a strain substantially corresponds to zero when being bent. In the present exemplary embodiment, by forming the thickness (tb) of the bending area BA of the flexible substrate 740 smaller than the thickness (td) of the display area DA and the thickness (tn) of the non-bending area NA, the neutral surface NP in the bending area BA may be positioned inside the overcoat 830 instead of the flexible substrate 740. Accordingly, tensile stress applied to the wire portion 820 may be converted into compressive stress, thereby preventing the wire portion 820 from being cut.

At a border between the display area DA and the bending area BA of the flexible substrate 740 and at a border between the bending area BA and the non-bending area NA of the flexible substrate 740, a lateral surface of the flexible substrate 740 may have a reverse tapered shape. The flexible substrate 740 may be patterned through the backside etching process, and accordingly, the lateral surface of the flexible substrate 740 may have the reverse tapered shape at a portion where the backside etching process is performed.

Hereinafter, a manufacturing method of the display device according to the exemplary embodiment will be described with reference to FIG. 12 to FIG. 14.

Figure 12:
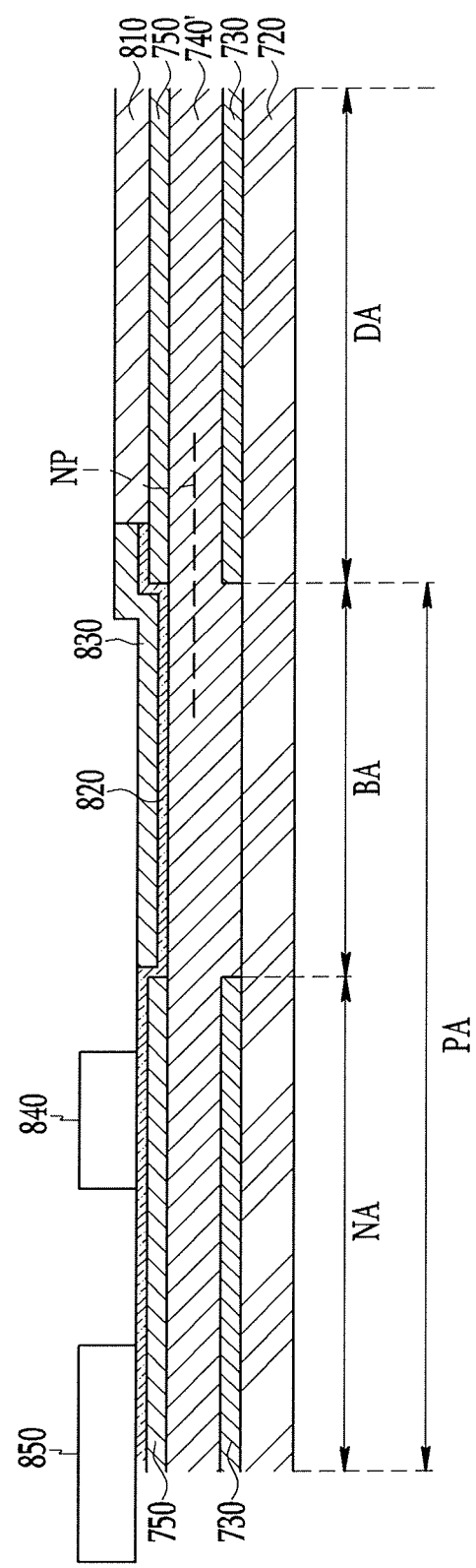
FIG. 12 to FIG. 14 illustrate process cross-sectional views of a manufacturing method of a display device according to an exemplary embodiment.
Figure 13:
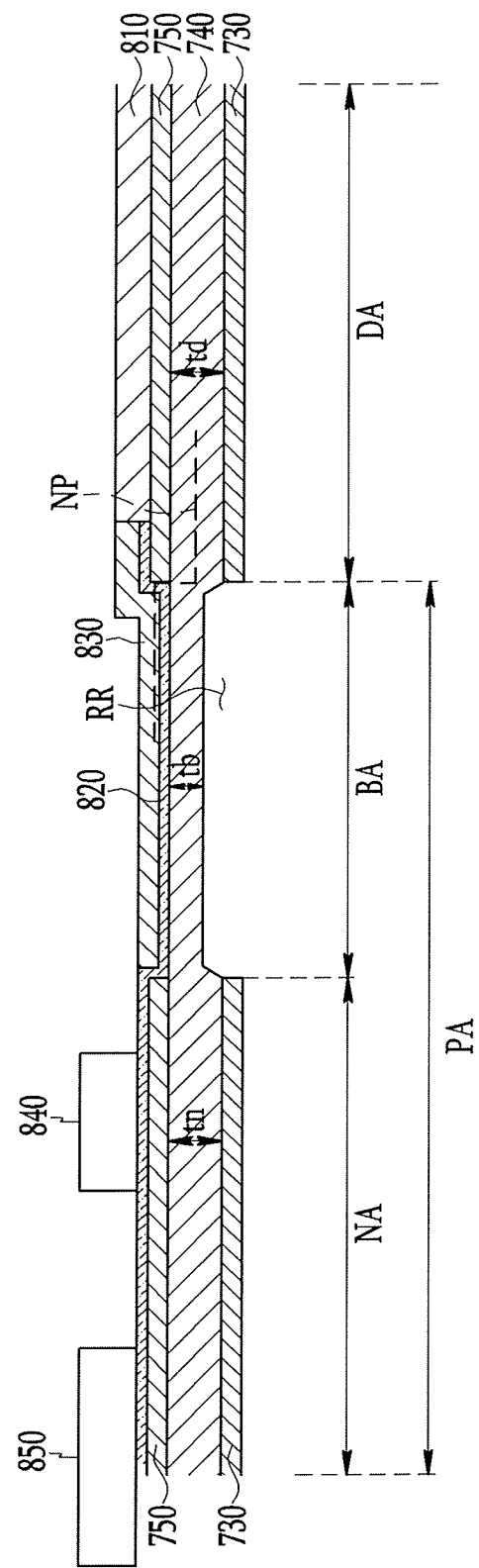
Figure 14:
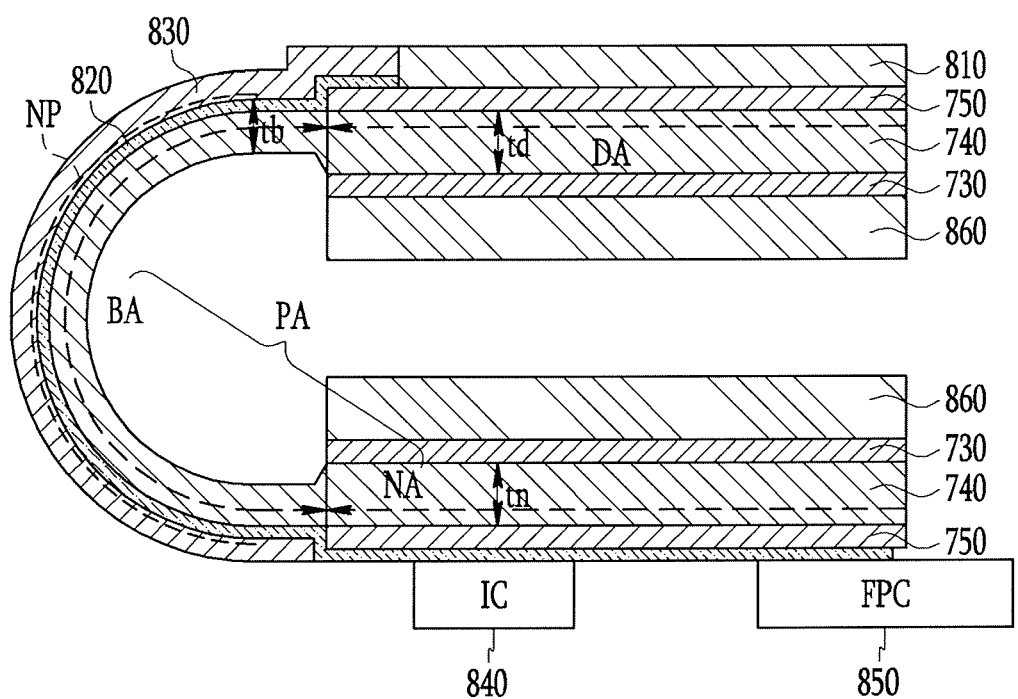

FIG. 12 to FIG. 14 illustrate process cross-sectional views of a manufacturing method of a display device according to an exemplary embodiment.

As shown in FIG. 12, an auxiliary flexible substrate 720 made of the flexible material is formed on a carrier substrate (not shown) made of the solid material. The auxiliary flexible substrate 720 may be formed to be a film type including one of a polyester-based polymer, a silicon-based polymer, an acryl-based polymer, a polyolefin-based polymer, and a copolymer thereof.

The protective mask 730 is formed by depositing a metal or inorganic insulating material on the auxiliary flexible substrate 720 and then patterning it. The protective mask 730 may be formed as a single layer or a multilayer. For example, the protective mask 730 may be formed by sequentially depositing silicon nitride (SiNx), silicon oxide (SiOx), and amorphous silicon (a-Si), and then simultaneously patterning them.

A preliminary flexible substrate 740' is formed on the auxiliary flexible substrate 720 and the protective mask 730 by using a flexible material. The preliminary flexible substrate 740' may be made of the same material as that of the auxiliary flexible substrate 720, or may be made of a different material from that the auxiliary flexible substrate 720.

The preliminary flexible substrate 740' includes a display area DA and a peripheral area PA. The peripheral area PA of the flexible substrate 740 includes a bending area BA and a non-bending area NA. The protective mask 730 is formed to overlap the display area DA and the non-bending area NA of the preliminary flexible substrate 740'. The protective mask 730 does not overlap the bending area BA of the flexible substrate 740.

The pixel portion 810 is formed on the display area DA of the preliminary flexible substrate 740', and the driving circuit portion 840 is formed on the non-bending area NA of the preliminary flexible substrate 740'. The flexible circuit board 850 may be further formed on the non-bending area NA of the preliminary flexible substrate 740'. The buffer layer 750 may be further formed between the preliminary flexible substrate 740' and the pixel portion 810, between the preliminary flexible substrate 740' and the driving circuit portion 840, and between the preliminary flexible substrate 740' and the flexible circuit board 850. In addition, the wire portion 820 for connecting the pixel portion 810 and the driving circuit portion 840 may be further formed. The wire portion 820 may connect the driving circuit portion 840 and the flexible circuit board 850. The overcoat 830 may be further formed on the wire portion 820.

Subsequently, the carrier substrate may be separated and removed from the auxiliary flexible substrate 720.

As shown in FIG. 13, a dry etching process is performed through an oxygen plasma treatment at a rear surface of the display device. Since a lower surface of the auxiliary flexible substrate 720 is entirely exposed, the auxiliary flexible substrate 720 is entirely removed by the etching process. Some of the preliminary flexible substrate 740' is covered by the protective mask 730, and the remaining part thereof is exposed. Accordingly, the preliminary flexible substrate 740' is patterned using the protective mask 730 as an etching mask. A thickness of a portion of the preliminary flexible substrate 740' that does not overlap the protective mask 730 decreases or is recessed, and a portion of the preliminary flexible substrate 740' that overlaps the protective mask 730 remains.

In this case, since the backside etching process is performed, a lateral surface of the flexible substrate 740 formed from the preliminary flexible substrate 740' has a reverse tapered shape at a border between the display area DA and the bending area BA of the flexible substrate 740 and at a border between the bending area BA and the non-bending area NA of the flexible substrate 740. For example, the bending area BA of the flexible substrate 740 is recessed from a lower surface thereof to form a recessed region RR. For example, an width W of the recess region RR is upwardly decreasing from the lower surface of the flexible substrate 740 contacting the protective mask 730 to an upper surface of the flexible substrate 740 contacting the buffer layer 750.

In the backside etching process using ultraviolet rays, when the ultraviolet rays reach the thin film transistor TR of the pixel portion 810, characteristics of the thin film transistor TR may be changed. In the present exemplary embodiment, since the ultraviolet rays are blocked by the flexible substrate 740 so that the ultraviolet rays do not reach the pixel portion 810 during the backside etching process, the characteristics of the thin film transistor is maintained after the backside etching process.

In FIG. 12, the neutral surface NP of the display device according to the present exemplary embodiment is positioned inside the flexible substrate 740. In FIG. 13, as the thickness (tb) of the bending area BA of the flexible substrate 740 decreases, a position of the neutral surface NP is changed in a corresponding area. For example, the neutral surface NP in the bending area BA is positioned inside the overcoat 830 instead of the flexible substrate 740. Accordingly, tensile stress applied to the wire portion 820 may be converted into compressive stress, thereby preventing the wire portion 820 from being cut.

As shown in FIG. 14, the protection film 860 may be formed on the protective mask 730. The protection film 860 may be adhered to the protective mask 730 by an adhesive layer (not shown).

Subsequently, the bending area BA of the flexible substrate 740 is bent such that the display area DA and the non-bending area NA of the flexible substrate 740 face each other.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A manufacturing method of a display device, comprising:

forming an auxiliary flexible substrate;

forming a protective mask on the auxiliary flexible substrate;

forming a preliminary flexible substrate on the auxiliary flexible substrate and the protective mask, the preliminary flexible substrate directly contacting a top surface of the protective mask and a top surface of the auxiliary flexible substrate on opposite side surfaces of the protective mask;

forming a thin film transistor and a first electrode connected to the thin film transistor on the preliminary flexible substrate; and patterning the auxiliary flexible substrate and the preliminary flexible substrate by using the protective mask to form a final flexible substrate.

2. The manufacturing method of the display device of claim 1, wherein in the patterning of the auxiliary flexible substrate and the preliminary flexible substrate, rear surfaces of the auxiliary flexible substrate and the preliminary flexible substrate are etched.

3. The manufacturing method of the display device of claim 2, wherein in the patterning of the auxiliary flexible substrate and the preliminary flexible substrate, the auxiliary flexible substrate is entirely removed, and a lateral surface of the final flexible substrate has a reverse tapered shape.

4. The manufacturing method of the display device of claim 1, further comprising forming an encapsulation layer on the first electrode, and etching the protective mask and the encapsulation layer.

5. The manufacturing method of the display device of claim 4, wherein the protective mask is made of metal or an inorganic insulating material.

6. The manufacturing method of the display device of claim 4, wherein in the etching of the protective mask, a thickness of the protective mask decreases.

7. The manufacturing method of the display device of claim 6, wherein the protective mask includes amorphous silicon.

8. The manufacturing method of the display device of claim 1, wherein the final flexible substrate overlaps the thin film transistor.

9. The manufacturing method of the display device of claim 8, wherein the final flexible substrate includes a polyimide.

10. The manufacturing method of the display device of claim 1, further comprising: forming an adhesive layer on the protective mask; and forming a protection film on the adhesive layer.

11. A manufacturing method of a display device, comprising:

forming an auxiliary flexible substrate;

forming a protective mask on a first surface of the auxiliary flexible substrate;

forming a preliminary flexible substrate on the first surface of the auxiliary flexible substrate and the protective mask so that the preliminary flexible substrate covers the protective mask, directly contacts the first surface of the protective mask, and directly contacts the first surface of the auxiliary flexible substrate on opposite side surfaces of the protective mask;

forming a pixel portion on the preliminary flexible substrate; and performing an etching process on a second surface of the auxiliary flexible substrate to form a final flexible substrate having a lateral surface in a reverse tapered shape, wherein the second surface of the auxiliary flexible substrate is opposite to the first surface of the auxiliary flexible substrate.

12. The manufacturing method of claim 11, wherein the performing of the etching process includes:

removing entirely the auxiliary flexible substrate to expose the protective mask and; and etching the preliminary flexible substrate using the protective mask as an etching mask.

13. The manufacturing method of claim 12, wherein the etching of the preliminary flexible substrate includes partially remove the preliminary flexible substrate which is not covered by the protective mask to form the final flexible substrate.

14. The manufacturing method of claim 11, wherein the performing of the etching process uses an oxygen plasma generated by ultraviolet rays.

15. The manufacturing method of claim 14, wherein the protective mask is formed of a material preventing the ultraviolet rays from passing through the protective mask.

16. The manufacturing method of claim 15, wherein the protective mask includes amorphous silicon.

* * * * *